(12) United States Patent
Alvandpour et al.

(10) Patent No.: US 6,549,040 B1
(45) Date of Patent: Apr. 15, 2003

(54) LEAKAGE-TOLERANT KEEPER WITH DUAL OUTPUT GENERATION CAPABILITY FOR DEEP SUB-MICRON WIDE DOMINO GATES

(75) Inventors: Atila Alvandpour, Portland, OR (US); Krishnamurthy Soumyanath, Portland, OR (US); Ram K. Krishnamurthy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 09/608,683

(22) Filed: Jun. 29, 2000

(51) Int. Cl.[7] .............................................. H03K 19/096
(52) U.S. Cl. ................................ 326/98; 326/96; 326/97
(58) Field of Search ................................. 326/93, 95–98

(56) References Cited

U.S. PATENT DOCUMENTS 5,457,404 A * 10/1995 Sharpe-Geisler ............. 326/17
5,517,136 A * 5/1996 Harris et al. ................. 326/93
5,917,355 A * 6/1999 Klass .......................... 327/208
6,040,716 A * 3/2000 Bosshart ...................... 326/98

FOREIGN PATENT DOCUMENTS

JP 4-96421 * 3/1992 .................. 326/98

* cited by examiner

*Primary Examiner*—Tuan T. Lam
(74) *Attorney, Agent, or Firm*—Blakely, Sokoloff, Taylor & Zafman LLP

(57) ABSTRACT

A circuit including a clock signal input to receive a clock signal, at least one data signal input to receive at least one data signal, and a multiple input conditional inverter to receive the clock signal and the data signal, and to generate a dynamic output. The circuit also includes a conditional keeper circuit to charge a dynamic output node when the clock is evaluating and the dynamic output is high.

24 Claims, 4 Drawing Sheets

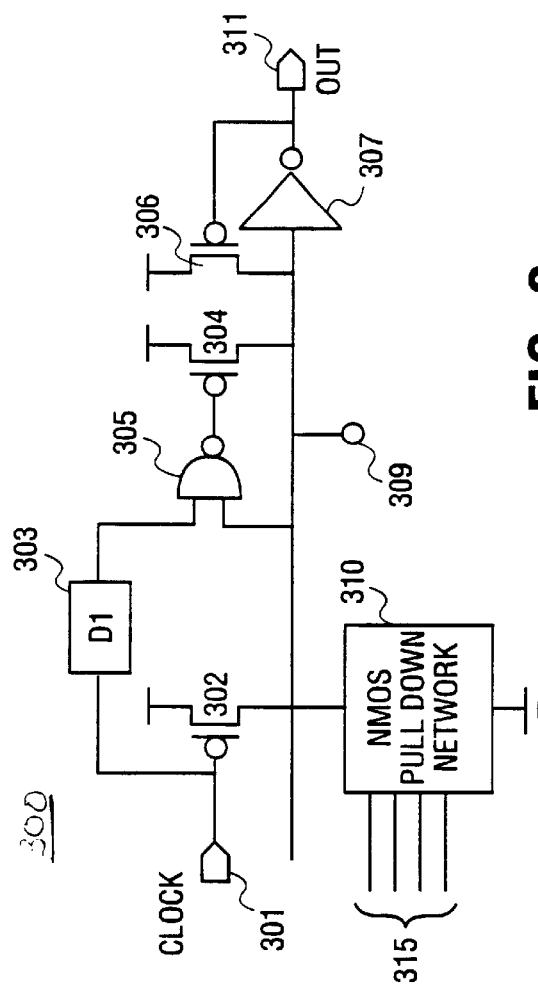
FIG. 3
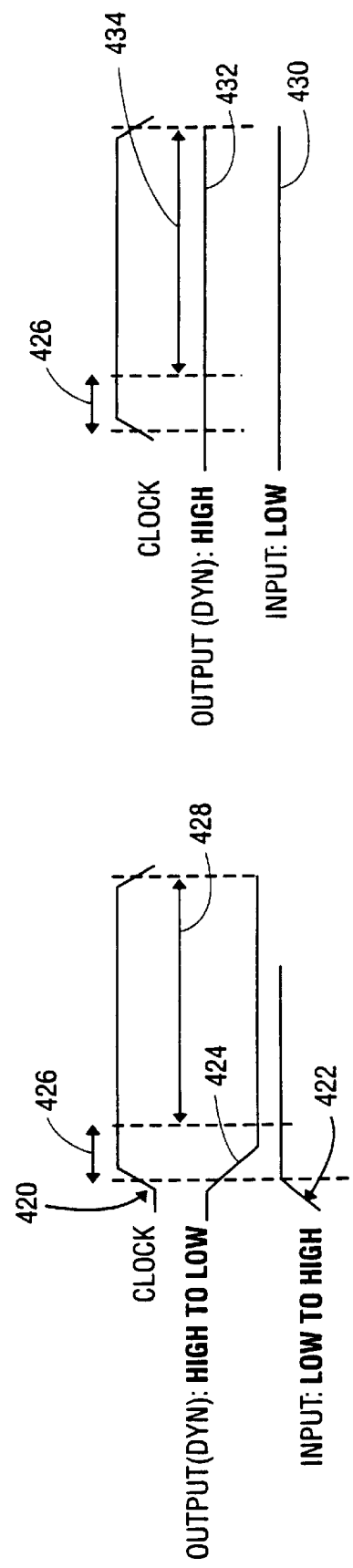
FIG. 4A
FIG. 4B

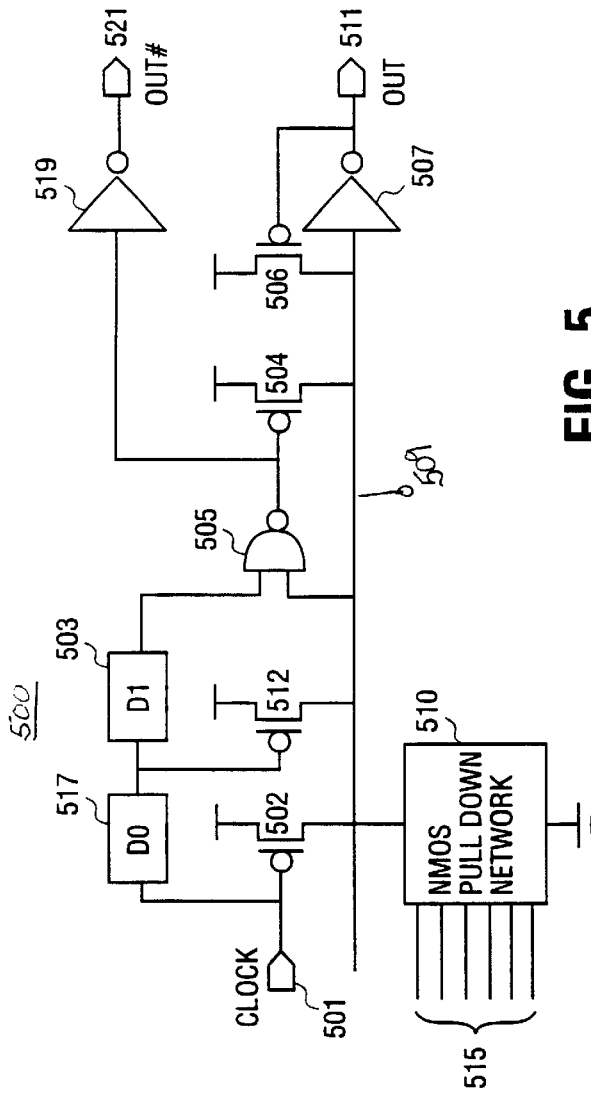
FIG. 5
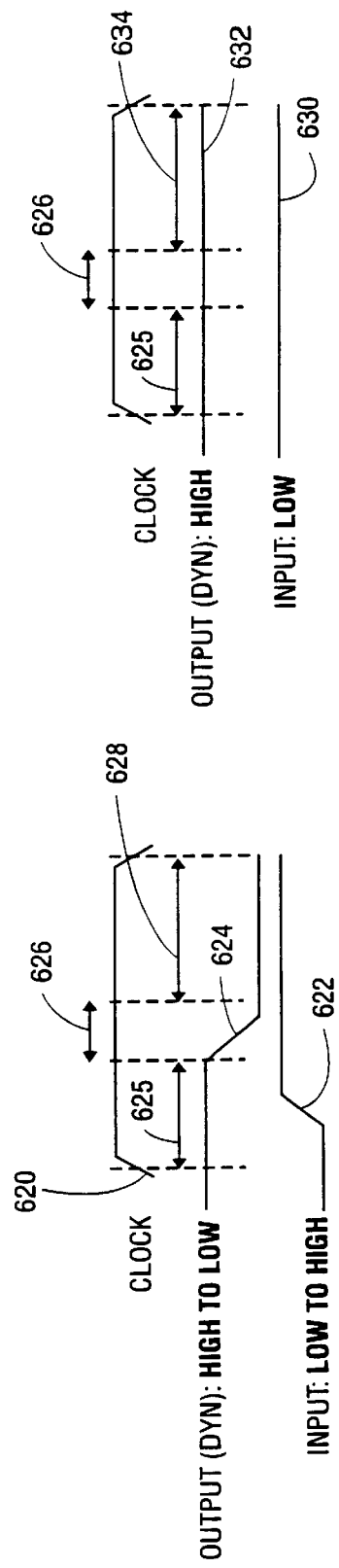
FIG. 6A
FIG. 6B

LEAKAGE-TOLERANT KEEPER WITH DUAL OUTPUT GENERATION CAPABILITY FOR DEEP SUB-MICRON WIDE DOMINO GATES

FIELD OF THE INVENTION

The present invention generally relates to integrated circuits (ICs). More particularly, the present invention relates to ICs incorporating dynamic or domino logic circuits.

BACKGROUND OF THE INVENTION

A static CMOS gate is a fully complementary logic gate (with P and N devices configured to implement a desired logic function). A dynamic CMOS gate consists of an N-device logic structure having an output node pre-charged to $V_{cc}$ with a single clocked PMOS device and being conditionally discharged (evaluated) by a set of n-devices connected to $V_{ss}$.

The clocked PMOS device has a gate connected to an input clock signal. When the clock input is active, the output node is "precharged" through the PMOS device to $V_{cc}$. When the clock input is inactive, the output node is conditionally discharged (evaluated) through the N-devices to $V_{ss}$. The set of N-devices implement the logic function.

Dynamic or domino logic units are referred to as being "dynamic" because operation of the unit is controlled dynamically by the input clock signal. The logic units are typically arranged in a plurality of stages, each having logic cells such as NAND gates, NOR gates, etc., with each stage separated by an inverting stage. With this arrangement, input signals applied to the first stage while the clock signal is active trigger operation of the remaining stages in sequence yielding a domino-like signal propagation effect within the logic unit—hence, the alternative name "domino" circuit.

One of the requirements for correct operation is that during the evaluate phase, the inputs to the N-device can only change from a non-active to an active state. Otherwise, the output could be corrupted, and there is no set of PMOS devices to pull it back up.

In use, dynamic or domino logic units operate in two phases—a pre-charge phase and an evaluate phase. During the pre-charge phase, logic cells of the domino circuit are pre-charged. During the evaluate phase, input signals are applied to the inputs of each of the logic cells and the clock signal is activated. Depending upon the inputs, some of the logic cells of the domino circuit may need to discharge to pull the output line of the logic cell from high to low, thereby sinking current from the power supply.

A disadvantage of domino logic circuits, however, is that leakage currents may flow through the n-type transistors even when the n-type transistors should be off. Thus, a high value at the dynamic output may be pulled down to low, causing loss of data.

One approach to compensating for the leakage current is to use a keeper circuit. A typical keeper circuit, called a half keeper, includes an inverter and a p-type transistor. The inverter includes an input and an output. The input of the inverter is coupled to the dynamic output of the domino logic circuit and the output of the inverter is coupled to an output, which may be connected to the next domino stage and to the gate of the p-type transistor. The source of the p-type transistor is coupled to a positive power supply voltage Vcc and the drain of the p-type transistor is coupled to the dynamic output of the domino logic circuit. Thus, when the dynamic output of the domino logic circuit is high, the p-type transistor of the keeper circuit will be on, further charging the dynamic output of the domino logic circuit to high.

However, the electrical behavior of the MOS transistors is dramatically changing with progress in device scaling. Particularly, the sub-threshold currents, which are exponentially increasing, result in significant increase of power consumption and large leakage current. The increasing leakage currents are severely limiting to performance, robustness, and consequently practical use of domino circuits. Leakage currents are predominantly critical to wide Domino gates with many parallel pull-down transistors, such as wide "OR" gates. This class of domino gates often generates fewer logic levels, which in turn can result in compact, high-performance, and relatively low power circuits, useful in design of memory, control, and wide arithmetic units.

Stronger p-type transistors are required in keeper circuits to compensate for the larger leakage currents in domino logic circuits. However, a stronger p-transistor (keeper) increases the contention at the dynamic output, and this degrades the performance of the domino circuits. The gain of the traditional keeper is bounded and must be low enough to allow the pull-down network to complete a potential High-to-Low transition. The gate output transition time is dependent on the gain ratio of the keeper and the weakest pull-down branch, as both the charge in the storage capacitance and additional charge, initially supplied by the keeper, must be drained out during a High-to-Low transition.

Thus, a stronger keeper increases the delay of the domino gate, and the conventional solution involves a trade-off between robustness and performance, and shows difficulty in handling relatively large leakage in wide domino stages created by low threshold voltage sub-micron devices. This shortcoming becomes even more critical for medium and low frequency operations.

BRIEF DESCRIPTION OF THE DRAWINGS

The present invention is illustrated by way of example and not limitation in the figures of the accompanying drawings, in which like references indicate similar elements and in which:

FIG. 3 is a circuit diagram of an embodiment of a domino circuit with a leakage tolerant keeper;

FIGS. 4a and 4b are waveform diagrams illustrating the operation of the circuit depicted in FIG. 3;

FIG. 5 is a circuit diagram of another embodiment of a domino circuit with a leakage tolerant keeper;

FIGS. 6a and 6b are waveform diagrams illustrating the operation of the circuit depicted in FIG. 5.

DETAILED DESCRIPTION

A method and apparatus for a domino gate with an leakage tolerant keeper are described. In one embodiment, the leakage tolerant keeper charges a dynamic output node of the domino gate only when the output is high during evaluation period of a clock. This allows the use of strong p-type transistors to charge the dynamic output node to compensate for large leakage currents. In another embodiment, more than one p-type transistor may be used to compensate for the large leakage currents. In one embodiment, the leakage tolerant keeper of the present invention tolerates an average of three times larger leakage current compared to the conventional keeper without any significant increase in propagation delay of the gate. The leakage tolerant keeper also has a capability of generating a domino-compatible dual output, which, if required, may result in significant power savings and less area overhead in comparison to solutions utilizing differential domino circuits.

Figure 1:
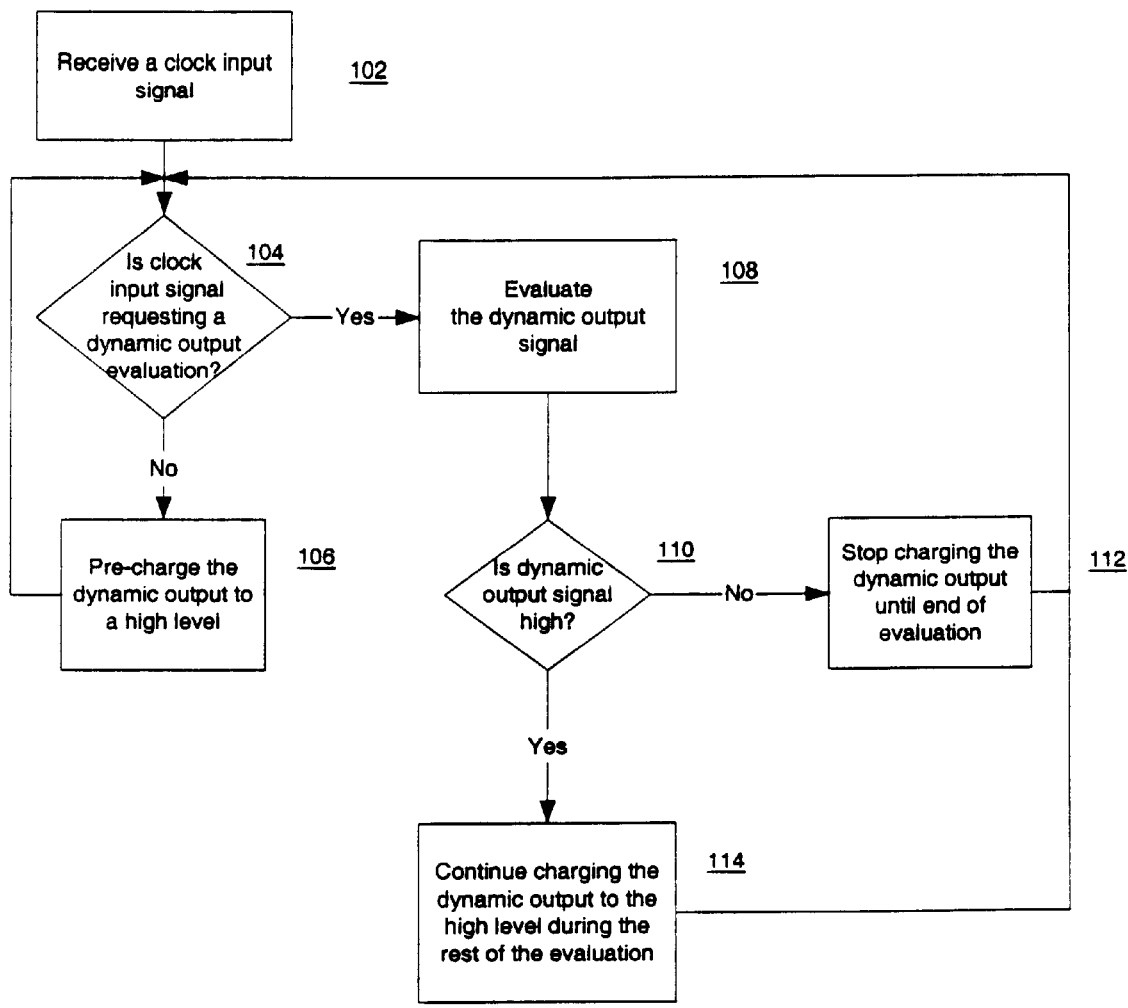
FIG. 1 is a flow diagram of the operation of a domino circuit with a leakage tolerant keeper.

FIG. 1 is a flow diagram of the operation of a domino circuit with a leakage tolerant keeper. The domino circuit receives a clock input signal 102. The domino circuit checks to see if the clock input signal is requesting a dynamic output evaluation 104. The evaluation period of a domino circuit occurs when the clock signal is high. If the clock signal is not requesting a dynamic output evaluation, the domino circuit precharges the dynamic-output to a high level 106, and checks again if the clock input signal requests a dynamic output evaluation 104.

If the clock input signal is requesting a dynamic output evaluation, the leakage tolerant keeper circuit evaluates the dynamic output signal 108. The leakage tolerant keeper determines if the dynamic output signal is high 110. If the dynamic output signal is low, the leakage tolerant keeper will stop charging the dynamic output until the end of the evaluation period of the clock 112. The domino circuit then checks again to see if the clock input signal is requesting a dynamic output evaluation 104. It will be understood that, in some embodiments, it will not be necessary for the leakage tolerant keeper to stop charging the dynamic output signal because the keeper would start charging the dynamic output only when the dynamic output signal was high during the evaluation phase.

If the dynamic output signal is high, the leakage tolerant keeper will continue charging the dynamic output to the high level during rest of the evaluation 114. The domino circuit then checks again to see if the clock signal is requesting a dynamic output evaluation 104.

Figure 2:
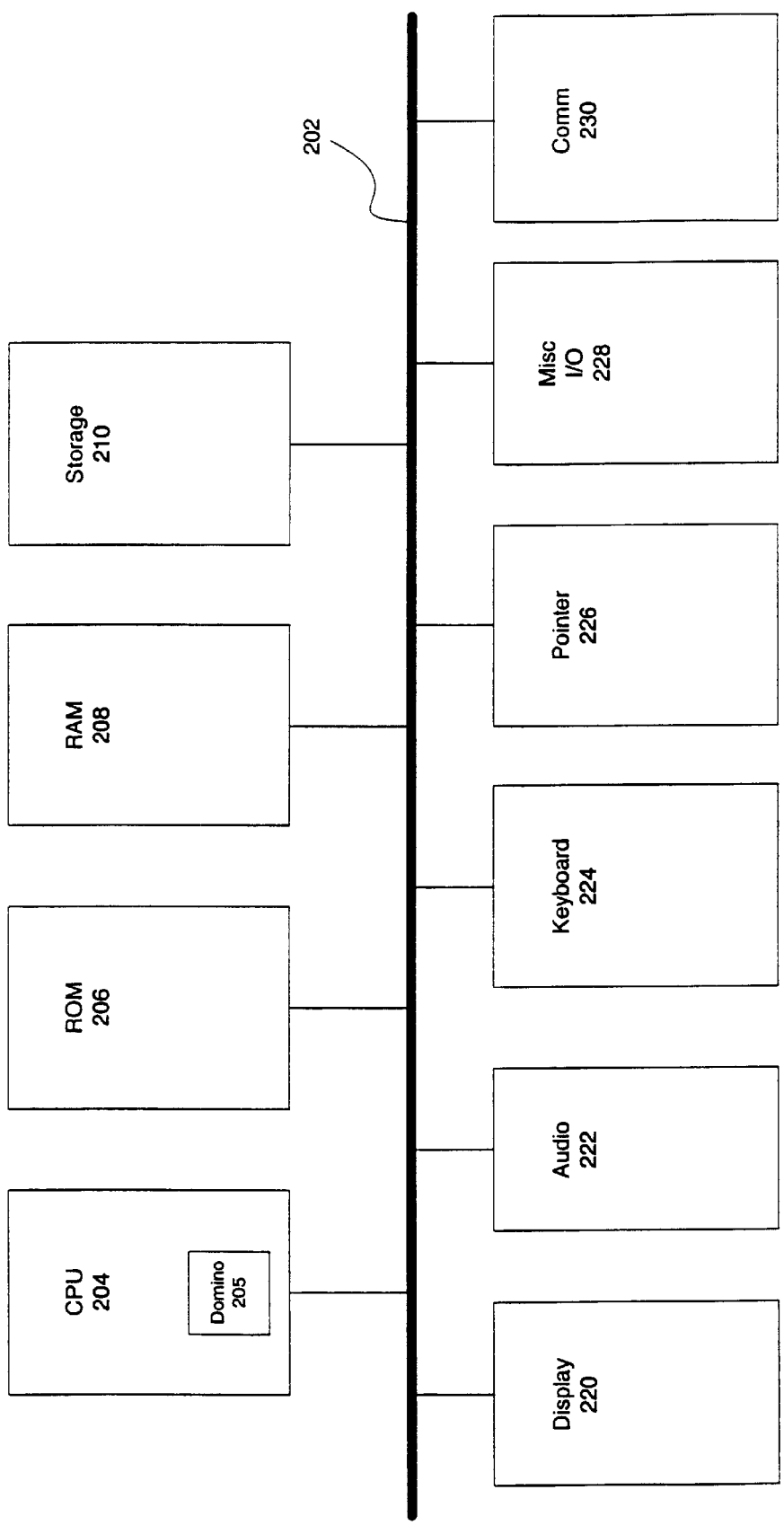
FIG. 2 is a block diagram of a computer system.

FIG. 2 is a block diagram of a computer system. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), etc. The CPU 204 may be a single, multiple, or even a distributed computing resource. The ROM 206 may be any type of non-volatile memory, which may be programmable such as, mask programmable, flash, etc. RAM 208 may be, for example, static, dynamic, synchronous, asynchronous, or any combination. Storage 210, may be Compact Disc (CD), Digital Versatile Disk (DVD), hard disks, optical disks, tape, flash, memory sticks, video recorders, etc. Display 220 might be, for example, a Cathode Ray Tube (CRT), Liquid Crystal Display (LCD), a projection system, Television (TV), etc. Audio 222 may be a monophonic, stereo, three dimensional sound card, etc. The keyboard 224 may be a keyboard, a musical keyboard, a keypad, a series of switches, etc. The pointer 226, may be, for example, a mouse, a touchpad, a trackball, joystick, etc. I/O devices 228, might be a voice command input device, a thumbprint input device, a smart card slot, a Personal Computer Card (PC Card) interface, virtual reality accessories, etc., which may optionally connect via an input/output port 229 to other devices or systems. An example of a miscellaneous I/O device 228 would be a Musical Instrument Digital Interface (MIDI) card. Communications device 230 might be, for example, an Ethernet adapter for local area network (LAN) connections, a satellite connection, a settop box adapter, a Digital Subscriber Line (xDSL) adapter, a wireless modem, a conventional telephone modem, a direct telephone connection, a Hybrid-Fiber Coax (HFC) connection, cable modem, etc. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

The present invention is capable of being embodied in each of the blocks of the computer system described above. Domino circuit 205 in the CPU 204 may be used, for example, in high speed microprocessors, and other high-speed very large scale integration (VLSI) circuits.

A machine-readable medium includes any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

FIG. 3 is a circuit diagram of an embodiment of a domino circuit with a leakage tolerant keeper. The domino circuit with leakage tolerant keeper 300 includes an input node to receive a clock signal 301, input nodes 315 to receive data signals, a dynamic output node 309, an output node 311, p-type transistors 302, 304, 306, delay element 303, NAND gate 305, inverter 307 and NMOS pull down network 310.

The source of p-type transistor 302 is connected to a positive power supply voltage Vcc. The drain of p-type transistor 302 is coupled to the dynamic output 309, a first input of NAND gate 305, the input of inverter 307 and the NMOS pull down network 310. The gate of p-type transistor 302 is coupled to the clock input 301.

Clock input 301 is also connected to the input of delay element of 303. The output of delay element 303 is coupled to a second input of NAND gate 305. The output of NAND gate 305 is coupled to the gate of p-type transistor 304. The source of p-type transistor 304 is connected to positive power supply voltage Vcc and the drain of p-type transistor 304 is connected to the dynamic output 309.

It will be understood that p-type transistor 306 is not necessary for the operation for the domino gate for leakage tolerant 300. However, if p-type transistor 306 is used, the source of p-type transistor 306 is connected to positive power supply voltage Vcc and the drain of p-type transistor 306 is connected to the dynamic output node 309. The gate of p-type transistor 306 is coupled to the output of inverter 307.

The input of inverter 307 is coupled to the dynamic output of 309. The output of inverter 307 is coupled to output 311.

The source of NMOS pull down network 310 is connected to a supply voltage Vss less positive power supply voltage Vcc, designated as ground by the ground signal. The NMOS pull down network receives as its input data input(s) 315. The NMOS pull down network may also receive the clock signal 301 as an input coupled to at least one gate of the NMOS pull down network. The drain of the NMOS pull down network is coupled to the dynamic output 309.

When the clock signal 301 is low, p-type transistor 302 charges dynamic output node 309 to Vcc. When clock signal 301 goes high, p-type transistor 304 will not be turned on to charge the dynamic output node 309 unless both the clock signal, delayed by delay element 303, and the dynamic output 309 are high, causing the output of the NAND gate 305 to be low.

Inverter 307 inverts the dynamic output signal to generate output 311 for use in another domino stage. If p-type transistor 306 is used, a high voltage at 309 will be inverted to a low voltage by inverter 307, turning on p-type transistor 306. Thus, since two p-type transistors 304, 306 are used to compensate for the leakage current, p-type transistor 306 need not be very strong. Thus, p-type transistor 306 will not keep dynamic output node 309 charged to a high level when input 315 is high, turning on the NMOS pull down network 310 to produce a low dynamic output 309.

FIGS. 4a and 4b are waveform diagrams illustrating the operation of the circuit depicted in FIG. 3. At 420, clock transitions from low to high, starting the evaluation phase. At 422, the input transitions from low to high, causing the dynamic output 309 to transition from high to low 424. Delay element 303 allows NMOS pull down network 310 to pull down the charge of dynamic output node 309 so that the inputs of NAND gate 305 are not both high, which would turn on p-type transistor 304. The period 426 is the delay introduced by the delay element 303, allowing the leakage tolerant keeper to evaluate the dynamic output level. Because the dynamic output level is low, the keeper circuit will remain off for the duration for the evaluation period as shown by 428.

In FIG. 4b, the input does not transition from low to high, but stays low as shown by 430. Thus, the dynamic output stays high as shown by 432. After the delay 426, introduced by delay element 303, the keeper circuit, including p-type transistors 304, 306 will be on to charge dynamic output node 309 for the duration of the evaluation period 434, since both the dynamic output 309 and the clock 301 are high.

FIG. 5 is a circuit diagram of another embodiment of a domino circuit with a leakage tolerant keeper. Domino circuit 500 includes clock input 501, dynamic output 509, output 511, output# 521, data input 515, p-type transistors 502, 512, 504, 506, delay elements 517, 503, NAND gate 505, inverters 507, 519 and NMOS pull down network 510. Domino circuit 500 may be used when it is not certain that the input low to high transition will be at the beginning of the clock evaluation. Delay element 517 adds a second delay to the evaluation period of the leakage tolerant keeper so that, if the dynamic output 509 goes down after a certain amount of delay, the leakage tolerant keeper will charge the dynamic output node 509 until the input goes high. When input 515 goes high dynamic output 509 will be pulled low to turn off p-type transistors 504 and 506.

Transistor 512 adds a second p-type transistor to charge output node 509 during the pre-charge. The source of transistor 512 is connected to Vcc and the drain of transistor 512 is connected to dynamic output node 509. The gate of p-type transistor 512 is connected to the output of delay element 517. The input of delay element 517 is connected to the input clock signal 501 and the output of delay element 517 is connected to the input of delay element 503 and the gate of p-type transistor 512. Thus, p-type transistor 512 will continue to charge dynamic output node 509 for a delay period introduced by delay element 517.

The input of inverter 519 is coupled to the output of NAND gate 505. The output of inverter 519 is coupled to output# 521. During the pre-charge phase, out# 521 is low, and thus may be connected to the next domino stage. Domino circuit 500 provides a domino-compatible dual output 511, 521, which if required, may result in significant power savings and less area overhead in comparison to solutions utilizing differential domino circuits. Thus, the leakage tolerant keeper can be used as the self-timed dual output generator for domino circuits.

FIGS. 6a and 6b are waveform diagrams illustrating the operation of the circuit depicted in FIG. 5. The clock transitions from low to high at 620, starting the evaluation phase. The input transitions from low to high 622 at a time after the clock transitions from low to high 620. The dynamic output transitions from high to low 624 in response to the input transition from low to high 622. A delay 625 is introduced by delay element 517, during which p-type transistors of the keeper circuit 512, 506 are on, to hold the high level of the dynamic output 509. Delay element 503 introduces delay 626 during which the keeper circuit evaluates whether the dynamic output 509 is low. Because the dynamic output level in FIG. 6a is low, the keeper circuit will turn off for the duration of the evaluation period 628.

In FIG. 6b, the input level does not change and remains low, as shown by line 630. Thus, the dynamic output level 632 remains high. During the delay 625 introduced by delay element 517, the keeper circuit remains on, to hold the high charge at dynamic output 509.

During the evaluation phase 626 of the keeper circuit, introduced by delay elements 503, p-type transistor 506 remains on, since the dynamic output 509 remains high. Because the dynamic output 509 and the clock input 501, delayed by delay elements 517, 503 are both high, the output of NAND gate 505 will be low, turning on p-type transistor 504 to charge dynamic output node 509. Thus, the keeper circuit including p-type transistors 504, 506 will be on for the duration 634 of the evaluation period of the clock cycle.

Delay elements 303 of FIG. 3 of 517, 503 of FIG. 5 may be designed using a pair of inverters, a pair of transmission gates, or any other circuit providing the desired delay times.

Thus, a method and apparatus for a buffer have been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

We claim:

1. A circuit comprising:
    a clock signal input to receive a clock signal;
    at least one data signal input to receive at least one data signal;
    a dynamic output coupled to the clock signal input and the at least one data signal input; and
    a conditional keeper circuit, coupled to the dynamic output, to hold a first gain rate on the dynamic output whenever the circuit is in an evaluating mode and the dynamic output is at a high logic level, and to hold a second gain rate on the dynamic output whenever the circuit is in the evaluating mode and the dynamic output is transitioning from the high logic level to a low logic level.

2. The circuit of claim 1 further comprising an inverter to invert the dynamic output.

3. The circuit of claim 2 wherein the conditional keeper circuit comprises:
    a delay element having an input to receive the clock signal and an output,
    a NAND gate having a first input to receive the output of the delay element, a second input to receive the dynamic output and an output; and
    a first p-type transistor having a source connected to a positive supply voltage, a drain connected to the dynamic output node and a gate coupled to the output of the NAND gate; and
    a second p-type transistor having a source connected to a positive supply voltage, a drain connected to the dynamic output node and a gate coupled to the inverter.

4. The circuit of claim 3 wherein the first p-type transistor and the second p-type transistor are activated whenever the circuit is operating in the pre-charge mode.

5. The circuit of claim 3 wherein the first p-type transistor is de-activated and the second p-type transistor is activated whenever the circuit transitions from the pre-charge mode to the evaluating mode.

6. The circuit of claim 5 wherein the first p-type transistor and the second p-type transistor are de-activated whenever the circuit is operating in the evaluating mode and the dynamic output is at a low level.

7. The circuit of claim 5 wherein the first p-type transistor is de-activated and the second p-type transistor are activated whenever the circuit is operating in the evaluating mode and the dynamic output is at a high level.

8. The circuit of claim 3 further comprising a second inverter having an input coupled to the output of the NAND gate and an output, the second inverter to generate a second output.

9. The circuit of claim 2, wherein the conditional keeper circuit comprises:
    a first delay element having an input to receive the clock signal and an output,
    a second delay element having an input to receive the output of the first delay element and an output;
    a NAND gate having a first input to receive the output of the second delay element, a second input to receive the dynamic output and an output;
    a first p-type transistor having a source connected to a positive supply voltage, a drain connected to the dynamic output node and a gate coupled to the output of the first delay element; and
    a second p-type transistor having a source connected to a positive supply voltage, a drain connected to the dynamic output node and a gate coupled to the output of the NAND gate; and
    a third p-type transistor having a source connected to a positive supply voltage, a drain connected to the dynamic output node and a gate coupled to the inverter.

10. The circuit of claim 9 wherein the first p-type transistor, the second p-type transistor and the third p-type transistor are activated whenever the conditional keeper holds a high gain on the dynamic output.

11. The circuit of claim 9 wherein the first p-type transistor is de-activated and the second p-type transistor is activated whenever the conditional keeper holds a low gain on the dynamic output.

12. The circuit of claim 11 wherein the first p-type transistor is de-activated and the second and third p-type transistors are activated whenever the circuit is operating in the evaluating mode and the dynamic output is at a high level.

13. The circuit of claim 11 wherein the first, second and third p-type transistors are de-activated whenever the circuit is operating in the evaluating mode and the dynamic output is at a low level.

14. The circuit of claim 9 further comprising a second inverter having an input coupled to the output of the NAND gate and an output, the second inverter to generate a second output.

15. A method comprising:
    receiving an input signal;
    receiving a low clock signal to generate a dynamic output;
    driving the dynamic output to a high level at a first gain rate with a conditional keeper circuit whenever the input signal is at a low logic level; and
    driving the dynamic output to a high level at a second gain rate with the conditional keeper circuit whenever the input signal is at a high logic level.

16. The method of claim 15 further comprising driving the dynamic output to a low level with a logic circuit whenever the input signal is at a low logic level.

17. The method of claim 15 further comprising inverting the dynamic output to generate a first output.

18. A conditional keeper circuit comprising:
    a delay element having an input to receive a clock signal and an output;
    a NAND gate having a first input to receive the output of the delay element, a second input to receive a dynamic output node and an output;
    a first p-type transistor having a source connected to a positive supply voltage, a drain connected to the dynamic output node and a gate coupled to the output of the NAND gate;

an inverter to coupled to the dynamic output node to invert a dynamic output signal; and a second p-type transistor including a source connected to a positive power supply voltage, a drain coupled to the dynamic output node, and a gate coupled to the output of the inverter;

wherein the conditional keeper holds a first gain rate on the dynamic output during an evaluating mode whenever the dynamic output node is at a high logic level, and holds a second gain rate on the dynamic output node during the evaluating mode whenever the dynamic output is transitioning from the high logic level to a low logic level.

19. The circuit of claim 18 further comprising a second inverter having an input coupled to the output of the NAND gate and an output.

20. The circuit of claim 18 wherein the delay element comprises a first delay element including an input to receive the clock signal and an output, and a second delay element to receive the output of the first delay element and an output coupled to the first input of the NAND gate, and the circuit further comprises:

a third p-type transistor having a source connected to a positive supply voltage, a drain connected to the dynamic output node and a gate coupled to the output of the first delay element.

21. The circuit of claim 20 wherein the first p-type transistor, the second p-type transistor and the third p-type transistor are activated whenever the conditional keeper holds a high gain on the dynamic output.

22. The circuit of claim 20 wherein the first p-type transistor is de-activated and the second p-type transistor is activated whenever the conditional keeper holds a low gain on the dynamic output.

23. The circuit of claim 22 wherein the first p-type transistor is de-activated and the second and third p-type transistors are activated during the evaluating mode whenever the dynamic output is at a high level.

24. The circuit of claim 22 wherein the first, second and third p-type transistors are de-activated during the evaluating mode whenever the dynamic output is at a low level.

* * * * *